United States Patent [19]
Tay

[11] Patent Number: 5,904,500
[45] Date of Patent: May 18, 1999

[54] METHOD FOR THE PREPARATION OF LEAD-ON-CHIP ASSEMBLIES

[75] Inventor: Swee-Teck Tay, Singapore, Singapore

[73] Assignee: The Dexter Corporation, Vindsor Locks, Conn.

[21] Appl. No.: 08/724,993

[22] Filed: Oct. 3, 1996

[51] Int. Cl.[6] .................................................. H01L 21/60
[52] U.S. Cl. ........................ 438/118; 438/123; 257/676
[58] Field of Search .................................... 437/209, 220; 257/666, 676; 438/118, 123

[56] References Cited

U.S. PATENT DOCUMENTS

| | | | |
|---|---|---|---|
| 3,808,028 | 4/1974 | Lando ......................................... | 156/2 |
| 4,627,151 | 12/1986 | Mulholland et al. ...................... | 29/589 |
| 4,642,321 | 2/1987 | Schoenberg et al. .................... | 523/400 |
| 5,030,308 | 7/1991 | Sheyon et al. ........................... | 156/235 |
| 5,173,766 | 12/1992 | Long et al. .............................. | 257/687 |
| 5,446,080 | 8/1995 | Shima et al. ............................. | 524/99 |
| 5,528,157 | 6/1996 | Newberry et al. ......................... | 437/8 |
| 5,536,970 | 7/1996 | Higashi et al. .......................... | 257/676 |
| 5,548,884 | 8/1996 | Kim ........................................ | 437/183 |

*Primary Examiner*—John Niebling
*Assistant Examiner*—Kevin F. Turner
*Attorney, Agent, or Firm*—Gray Cary Ware & Freidenrich; Stephen E. Reiter

[57] ABSTRACT

In accordance with the present invention, alternate lead-on-chip assembly methodologies have been developed which eliminate the use of a three layer film bonded to the leadframe, as currently employed in the art. According to the present invention, a dielectric paste is dispensed directly onto the top surface of the silicon die instead of the thermoplastic tape currently employed in the art. This approach required the development of apparatus and methods which meet the following requirements, e.g., 1) the method (and apparatus employed therefor) must provide comparable units/hour throughput to existing LOC assembly methods, and 2) the method must provide equivalent or superior package reliability when compared with tape bonded LOC packages. The invention method (and apparatus suitable for use therefor) satisfies these needs.

11 Claims, 2 Drawing Sheets

METHOD FOR THE PREPARATION OF LEAD-ON-CHIP ASSEMBLIES

FIELD OF THE INVENTION

The present invention relates to methods for the preparation of lead-on-chip asemblies, and apparatus useful therefor. In a particular aspect, the present invention relates to high throughput processes for the preparation of lead-on-chip asemblies.

BACKGROUND OF THE INVENTION

Lead-on-chip (LOC) assembly technology represents a method for control of package size by eliminating the distance between the edge of the die paddle and the tip of the lead finger. Conventional assembly methodologies employ silicon chips that have aluminized bond pads located along the periphery of the die. Die bonding involves adhesive dispense onto a leadframe die paddle followed by chip pick-and-place. The adhesive, which is typically a silver filled epoxy resin, is subsequently cured off-line in a box oven or cured in-line in a snap cure oven. Following curing, conventional gold wire bonding is performed.

Lead-on-chip assembly methodology differs in several important ways from conventional assembly methodologies. Indeed, LOC assembly methodology requires modifications to the assembly equipment, leadframe design and aluminum pad layout on the silicon chip. The modification to the silicon die is probably the most significant factor since mask modifications are required for both the aluminum metal and passivation layers. In addition, lead-on-chip assembly requires that the pads on the silicon die must be relocated from the die periphery to the central portion of the chip. Furthermore, the lengths of the lead fingers of the leadframe employed for the preparation of lead-on-chip assemblies are extended.

The preparation of lead-on-chip assemblies described in the prior art does not employ conventional die attach to the backside of the silicon die. Instead, a thermoplastic tape is bonded in a window frame configuration to the underside of the leadframe. Typically, the leadframe supplier applies the thermoplastic tape to the leadframe. The tape typically has three layers consisting of a polyimide film, sandwiched between two thermoplastic films. The polyimide film provides rigidity to the tape and alpha particle protection to the active structures of the silicon die.

Bonding of the components involved in the preparation of an LOC assembly involves heating of the leadframe and/or silicon chip to a temperature at which the thermoplastic film softens. The leadframe is aligned over the die and the two are brought into contact. As the thermoplastic film softens, it flows slightly and bonds to the passivating layer of the silicon die.

It would be desirable to be able to carry out high-throughput LOC assembly without the need to use the thermoplastic tapes employed in the art. In addition, it would be desirable to be able to selectively apply adhesive to the die and/or leadframe prior to bonding the two components together. However, commercially available equipment for conventional die bonding and customized equipment for tape-based lead-on-chip assembly cannot be directly retrofitted to accommodate paste-based LOC assembly. Accordingly, there is a need in the art for the development of apparatus and methods for the preparation of lead-on-chip asemblies employing paste-based adhesives.

BRIEF DESCRIPTION OF THE INVENTION

In accordance with the present invention, alternate LOC assembly methodologies have been developed which eliminate the use of a three layer film bonded to the leadframe, as currently employed in the art. According to the present invention, a dielectric paste dispensed directly onto the top surface of the silicon die is substituted for the thermoplastic tape currently employed in the art. This approach requires the development of apparatus and methods which must meet the following requirements, e.g., 1) The method (and apparatus employed therefor) must provide comparable units/hour throughput to existing LOC assembly methods, and 2) The method must provide equivalent or superior package reliability when compared with tape bonded LOC packages.

Invention methods and apparatus satisfy these and other requirements as will become apparent upon review of the specification and appended claims.

DETAILED DESCRIPTION OF THE INVENTION

Figure 1:
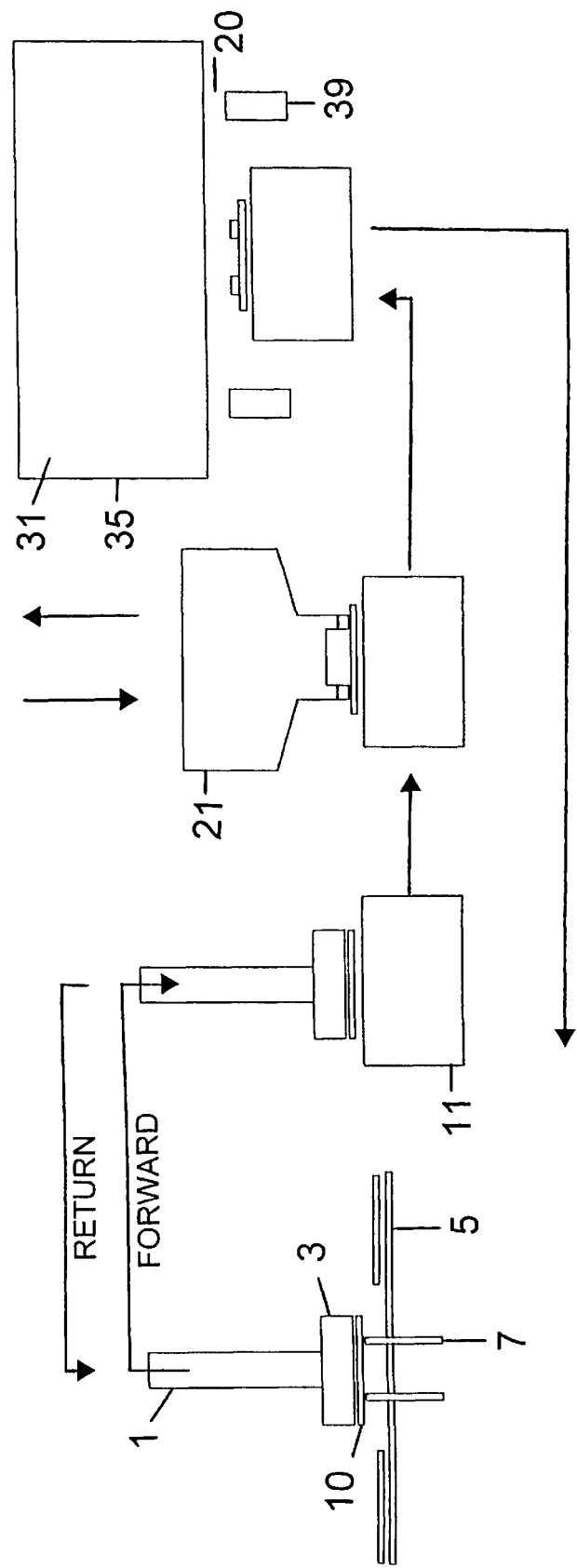
FIG. 1 presents a side view of an apparatus according to the present invention.

In accordance with the present invention, there are provided methods for bonding chip(s) to a leadframe to produce a lead-on-chip assembly, said method comprising:

applying an adhesive paste onto the top surface of a silicon chip, and contacting said chip with said leadframe under conditions suitable to promote cure of said adhesive paste.

As readily recognized by those of skill in the art, a wide variety of adhesive pastes can be employed in the practice of the present invention. Presently preferred pastes contemplated for use herein are hydrophobic materials (so as to minimize the water sensitivity of the resulting cured article). It is also preferred that adhesive pastes employed in the practice of the present invention be electrically insulating and possess a low dielectric constant.

An exemplary paste contemplated for use in the practice of the present invention is a maleimide-based paste. Presently preferred maleimides contemplated for use in the practice of the present invention include compounds having the structure I as follows:

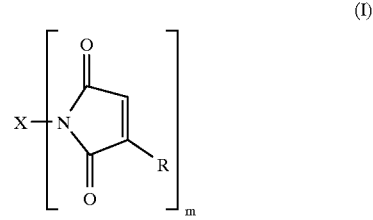

(I)

wherein:
m=1, 2 or 3,
each R is independently selected from hydrogen or lower alkyl, and
X is a monovalent or polyvalent radical selected from:

branched chain alkyl, alkylene or alkylene oxide species having from about 12 to about 500 carbon atoms, aromatic groups having the structure:

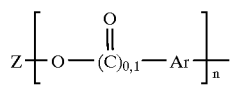

wherein:

n=1, 2 or 3, each Ar is a monosubstituted, disubstituted or trisubstituted aromatic or heteroaromatic ring having in the range of 3 up to 10 carbon atoms, and Z is a branched chain alkyl, alkylene or alkylene oxide species having from about 12 to about 500 atoms in the backbone thereof, or mixtures thereof.

As employed herein, the term "alkyl", refers to straight or branched chain alkyl radicals having in the range of about 1 up to 8 carbon atoms, and "lower alkyl" refers to straight or branched chain alkyl radicals having in the range of about 1 up to 4 carbon atoms.

As employed herein, the term "alkenyl" refers to straight or branched chain hydrocarbyl radicals having at least one carbon-carbon double bond, and having in the range of about 2 up to 8 carbon atoms.

As employed herein, the term "alkynyl" refers to straight or branched chain hydrocarbyl radicals having at least one carbon-carbon triple bond, and having in the range of about 2 up to 8 carbon atoms.

As employed herein, the term "alkoxy" refers to an oxygen-bearing alkyl moiety having the structure —OR, wherein R is an alkyl group as defined above.

As employed herein, the term "halogen" refers to fluoride, chloride, bromide or iodide radicals.

Presently preferred maleimides employed in the practice of the present invention include compounds having structure I, wherein X is an alkylene or alkylene oxide species having from about 20 to about 100 carbon atoms. An especially preferred maleimide for use herein is a compound having structure I, wherein X is a 10,11-dioctyl-1,20-eicosyl radical.

Especially preferred maleimide-based pastes contemplated for use in the practice of the present invention are maleimide resins filled with a perfluorinated hydrocarbon polymer. As readily recognized by those of skill in the art, a wide variety of perfluorinated hydrocarbon polymers can be employed for the preparation of adhesive compositions employed in the practice of the present invention. Many such materials are available commercially, for example, from DuPont under the tradename "Teflon" or from Hoechst-Celanese under the tradename "Hostafalon". Exemplary perfluorinated hydrocarbon polymers contemplated for use in accordance with the present invention are typically characterized as having a particle size in the range of about 0.1 up to about 100 μm, a surface area in the range of about 0.2 up to about 20 g/m², and a bulk density of at least 100 g/L.

Presently preferred perfluorinated hydrocarbon polymers employed in the practice of the present invention are characterized as having an average bulk density in the range of about 250–500 g/L, a melting peak temperature (as determined by ASTM D1457) of 325±5° C., an average particle size distribution in the range of about 8–15 μm, a specific surface area in the range of about 8–12 m²/g, and a relatively narrow molecular weight distribution.

As readily recognized by those of skill in the art, a wide variety of curing catalysts can be employed in the preparation of adhesive compositions contemplated for use herein. Typically in the range of 0.2 up to 3 wt % of at least one free radical initiator, based on the total weight of organic materials in the composition, i.e., in the absence of filler is employed. As employed herein, the term "free radical initiator" refers to any chemical species which, upon exposure to sufficient energy (e.g., light, heat, or the like), decomposes into two parts which are uncharged, but which each possesses at least one unpaired electron. Preferred as free radical initiators for use in the practice of the present invention are compounds which decompose (i.e., have a half life in the range of about 10 hours) at temperatures in the range of about 70 up to 180° C.

Exemplary free radical initiators contemplated for use in the practice of the present invention include peroxides (e.g., dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide), azo compounds (e.g., 2,2'-azobis(2-methylpropanenitrile), 2,2'-azobis(2-methylbutanenitrile), and 1,1'-azobis (cyclohexanecarbonitrile)), and the like. Peroxide initiators are presently preferred because they entail no gas release upon decomposition into free radicals. Those of skill in the art recognize, however, that in certain adhesive applications, the release of gas (e.g. $N_2$) during cure of the adhesive would be of no real concern. Generally in the range of about 0.2 up to 3 wt % of at least one free radical initiator (based on the total weight of the organic phase) will be employed, with in the range of about 0.5 up to 1.5 wt % preferred.

As readily recognized by those of skill in the art, a wide variety of additional components can optionally be incorporated into the above-described adhesive formulation, such as, for example, coupling agents, antioxidants, stabilizers, bleed control agents, additional fillers (other than the preferred perfluorinated hydrocarbon polymer), inert diluents, reactive diluents, adhesion promoters, flexibilizers, dyes, pigments, and the like.

Especially preferred maleimide-based pastes contemplated for use in the practice of the present invention are those which are capable of substantially completely curing in less than 10 seconds at a temperature in the range of about 100° C. up to about 240° C.

In summary, adhesive pastes contemplated for use herein will desirably meet a variety of performance criteria, e.g.:

a) a viscosity/thixotropic index amenable to high throughput processing, b) rapid cure kinetics (e.g., 5–10 seconds between about 100° C. up to about 240° C.), c) minimal resin bleed upon contact with die passivation materials (e.g., nitride, vapox, oxynitride and polyimide), d) sufficient rigidity to permit wire bonding between 180° C. and 240° C., e) low moisture absorption, i.e., moisture absorption in the pressure cooker of between about 0.2 up to 0.4 wt. percent at saturation, f) ROC 0.300" square die, 25 mils thick on 9 mil copper 0.5 to 1.0 meters, g) less than 10% degration in die shear (relative to as cured) following 168 hours in the pressure cooker, h) low levels of ionic impurities (all <10 ppm), i) good pot life (>24 hours), j) wide range of cure temperatures (i.e., range of at least about 100° C. up to about 240° C.), k) low levels of weight loss during snap curing curing (<0.10 wt. %), l) low levels of weight loss when ramped at 20° C./min. to 250° C. (<1.0 wt. %), m) low dielectric constant (<4.0), and n) excellent electrical resistivity (>$10^{10}$ W-cm)

Use of the paste concept for lead-on-chip assembly requires modification of the assembly process employed when using tape-based adhesives. FIG. 1 presents a schematic side view of an apparatus according to the invention for the preparation of LOC assemblies employing an adhesive paste. Thus, in accordance with another embodiment of the present invention, there are provided apparatus for bonding a chip to a leadframe to produce a lead-on-chip assembly, said apparatus comprising:

means to selectively apply an adhesive paste onto the top surface of a silicon chip, thereby producing an adhesively-treated silicon chip, means to transport said silicon chip into contact with said means to apply said adhesive paste, wherein said means to transport is capable of transporting said chip from the sticky foil on which said chip is obtained by dividing a silicon wafer into a plurality of chips, and means to bring said adhesively-treated silicon chip into contact with the leadframe under conditions suitable to promote curing of said adhesive paste.

Thus, the invention assembly process involves carrying out four basic steps as follows. The first step involves transfer of the silicon die from the sticky tape to a vacuum pickup tool. In step two, the tool facilitates transfer of the die to a vacuum chuck. In step three, the paste is applied to the top surface of the silicon die (employing any of a variety of techniques, such as, for example, screen printing, dispense, pad stamping, and the like). The pattern with which the paste is applied can vary considerably, e.g., two rectangular strips, the leadframe pattern overlapping the die or any other desired pattern. Since it is a paste that is being applied to the die, the pattern can easily be changed by merely changing the technique used for application (e.g., by changing the dispense head).

After the paste is dispensed, step four completes the attachment of the chip to the leadframe. The vacuum chuck holding the silicon chip is aligned under the leadframe which has been indexed and contacted to a heater block. The vacuum chuck is raised until the paste on the top surface of the silicon die embeds into the leadframe. Because the leadframe is heated to a suitable cure temperature, the paste cures within a matter of seconds. Following curing, the process flow for the tape Lead-on-Chip and the proposed paste version merge.

In accordance with yet another embodiment of the present invention, there are provided high-throughput processes for bonding chip(s) to a leadframe to produce a lead-on-chip assembly, said process comprising:

(a) transporting the first of a plurality of silicon chips into contact with means to apply adhesive paste, wherein said chips are transported from the sticky foil on which the silicon wafer from which said chip is obtained is divided into a plurality of chips, (b) dispensing an adhesive paste onto the top surface of said first silicon chip, (c) contacting said first silicon chip with said leadframe under conditions suitable to promote cure of said adhesive paste, and (d) repeating steps (a)–(c) with the second of said plurality of silicon chips, then with the third of said plurality of silicon chips, and so on, until all of said plurality of silicon chips have been so treated.

Thus, it can readily be seen that invention apparatus is uniquely suited to facilitate high throughput production of LOC assemblies employing adhesive pastes, rather than the adhesive tapes employed in the prior art.

The invention will now be described in greater detail by reference to the following non-limiting illustrations.

An embodiment of the invention process will now be illustrated with reference to FIGS. 1 and 2. Thus, as shown in FIG. 1, a chip 10 is raised off of sticky foil 5 by ejector pins 7. The chip is held by pick up tip 3, which is mounted on pickup shank 1. The pickup shank then carries the chip into position over vacuum chuck 11. Upon seating of the chip on the vacuum chuck, the pickup shank is retracted (or the vacuum chuck is repositioned) so that dispenser 21 can be positioned over the secured chip and adhesive paste applied thereto. Once adhesive has been applied to the chip, the vacuum chuck is repositioned so as to bring the adhesively-treated chip into contact with leadframe 20. Curing of the adhesive is facilitated by contact of the leadframe with heat block 31, which is protected from the leadframe by non-stick (e.g., teflon) coating 35. The leadframe is held in place during this contacting by bearings 39.

Figure 2:
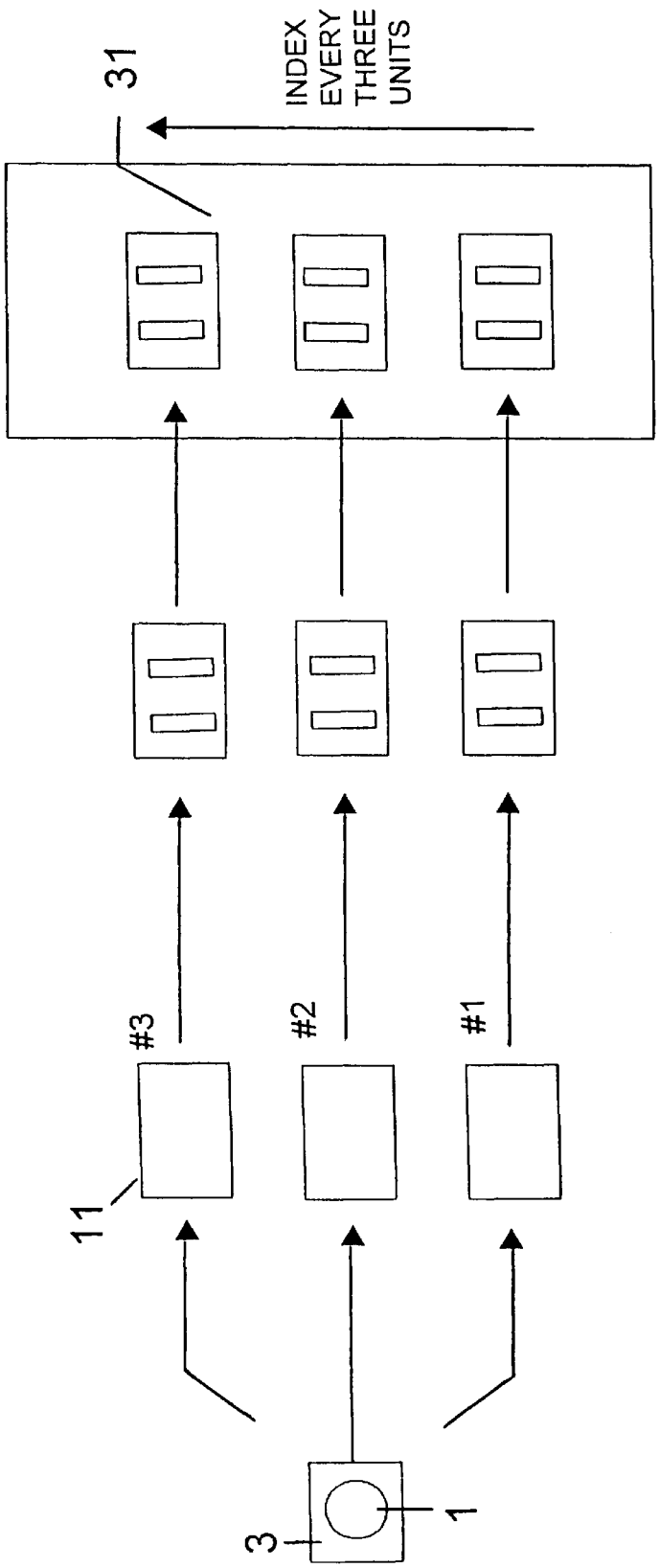
FIG. 2 presents a top view of an apparatus according to the present invention.

FIG. 2 provides an ovehead view of the process illustrated in FIG. 1, showing how a plurality of vacuum chucks 11, a plurality of dispensing stations 21 and a plurality of contacting stations can be integrated to facilitate high throughput preparation of LOC assemblies. It can be seen, therefore, based on the schematic views presented in FIGS. 1 and 2, that the invention apparatus makes possible the high throughput preparation of LOC assemblies employing an adhesive paste instead of adhesive tape as taught in the art.

While the invention has been described in detail with reference to certain preferred embodiments thereof, it will be understood that modifications and variations are within the spirit and scope of that which is described and claimed.

That which is claimed is:

1. A method for bonding a chip to a leadframe to produce a lead-on-chip assembly, said method comprising:

applying an adhesive paste onto the top surface of a silicon chip, wherein said adhesive paste is capable of substantially completely curing in less than 10 seconds at a temperature in the range of about 100° C. up to about 240° C., and contacting said chip with said leadframe under conditions suitable to promote cure of said adhesive paste.

2. A method according to claim 1 wherein said adhesive paste is hydrophobic.

3. A method according to claim 1 wherein said adhesive paste is electrically insulating and possesses a low dielectric constant.

4. A method according to claim 1 wherein said adhesive paste is a maleimide-based paste.

5. A method according to claim 4 wherein said maleimide-based paste is filled with a perfluorinated hydrocarbon polymer.

6. A method for selectively applying adhesive to a chip, said method comprising applying an adhesive paste onto the top surface of a silicon chip prior to contacting said chip with a leadframe, wherein said adhesive paste is capable of substantially completely curing in less than 10 seconds at a temperature in the range of about 100° C. up to about 240° C.

7. A high-throughout process for bonding a chip to a leadframe to produce a lead-on-chip assembly, said process comprising:

(a) transporting the first of a plurality of silicon chips into contact with means to apply adhesive paste, wherein said chips are transported from a sticky foil on which a silicon wafer from which said chip is obtained is divided into a plurality of chips, (b) dispensing an adhesive paste onto the top surface of said first silicon chip, wherein said adhesive paste is capable of substantially completely curing in less than 10 seconds at a temperature in the range of about 100° C. up to about 240° C., (c) contacting said first silicon chip with said leadframe under conditions suitable to promote cure of said adhesive paste, and (d) repeating steps (a)–(c) with the second of said plurality of silicon chips, then with the third of said plurality of silicon chips, and further with each succeeding chip of said plurality of chips until all of said plurality of silicon chips have been so treated.

8. A method according to claim 7 wherein said adhesive paste is a hydrophobic paste.

9. A method according to claim 7 wherein said adhesive paste is electrically insulating and possesses a low dielectric constant.

10. A method according to claim 7 said adhesive paste is a maleimide-based paste.

11. A method according to claim 10 wherein said maleimide-based paste is filled with a perfluorinated hydrocarbon polymer.

* * * * *